(12) United States Patent
Weber et al.

(10) Patent No.: US 11,600,991 B2
(45) Date of Patent: Mar. 7, 2023

(54) ELECTRICAL CIRCUIT ARRANGEMENT FOR AN ENERGY STORAGE SYSTEM AND METHOD FOR OPERATING SAID ELECTRICAL CIRCUIT ARRANGEMENT

(71) Applicant: Robert Bosch GmbH, Stuttgart (DE)

(72) Inventors: Jochen Weber, Asperg (DE); Joerg Schneider, Ludwigsburg (DE); Peter Kohn, Stuttgart (DE); Sabine Arnold, Oehningen/Wangen (DE); Thomas Kaiser, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 275 days.

(21) Appl. No.: 17/034,470

(22) Filed: Sep. 28, 2020

(65) Prior Publication Data

US 2021/0098984 A1 Apr. 1, 2021

(30) Foreign Application Priority Data

Sep. 27, 2019 (DE) .......................... 102019214824.7

(51) Int. Cl.
| | |
|---|---|
| H02H 7/00 | (2006.01) |
| H02H 7/18 | (2006.01) |
| H02H 1/00 | (2006.01) |
| H02J 7/00 | (2006.01) |
| H02J 9/06 | (2006.01) |
| H05K 1/18 | (2006.01) |

(52) U.S. Cl.
CPC ............ *H02H 7/18* (2013.01); *H02H 1/0007* (2013.01); *H02J 7/0031* (2013.01); *H02J 9/061* (2013.01); *H05K 1/181* (2013.01); *H02J 7/0047* (2013.01); *H05K 2201/1006* (2013.01); *H05K 2201/10037* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 5,982,142 | A  * | 11/1999 | Sullivan ................ | H02J 7/0018 320/118 |
| 9,214,819 | B2 * | 12/2015 | Butzmann ............. | H02J 7/0013 |
| 2012/0038213 | A1* | 2/2012 | Vogel ...................... | H02J 9/061 307/64 |
| 2018/0162300 | A1 | 6/2018 | Yasunori | |
| 2018/0334118 | A1 | 11/2018 | Masui et al. | |
| 2019/0190294 | A1 | 6/2019 | Sato et al. | |

FOREIGN PATENT DOCUMENTS

| | | |
|---|---|---|
| DE | 102018220026 A1 | 5/2019 |
| EP | 1333565 | 8/2003 |
| EP | 3316440 A1 | 5/2018 |
| EP | 3354520 A1 | 8/2018 |
| EP | 3360719 A1 | 8/2018 |
| KR | 20190016401 | 2/2019 |
| WO | 2015052137 A1 | 4/2015 |

* cited by examiner

*Primary Examiner* — Stephen W Jackson
(74) *Attorney, Agent, or Firm* — Michael Best & Friedrich LLP

(57) ABSTRACT

Electrical circuit arrangement for an energy storage system comprising a first electrochemical energy storage device and a second electrochemical energy storage device.

10 Claims, 1 Drawing Sheet

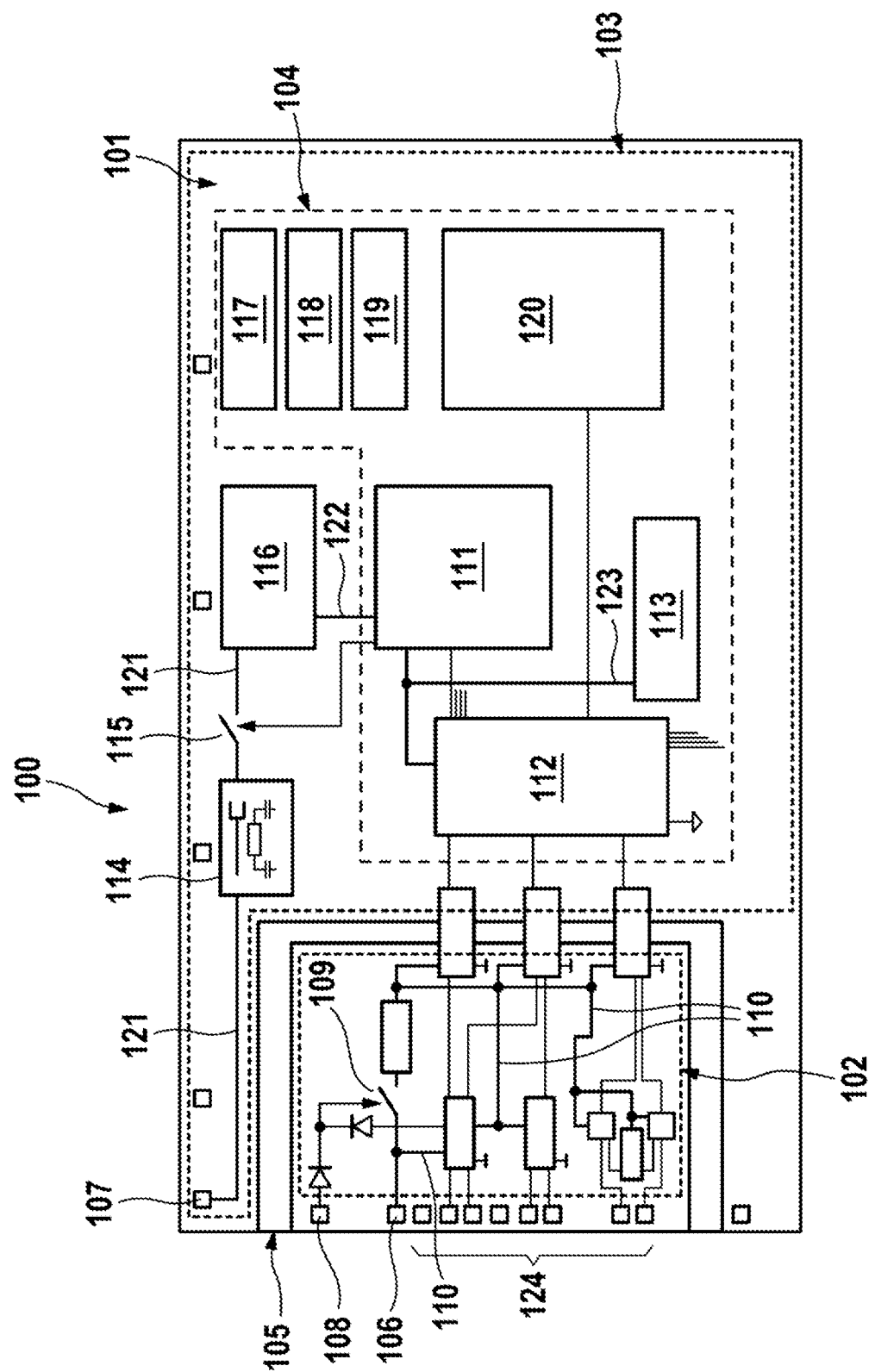

ELECTRICAL CIRCUIT ARRANGEMENT FOR AN ENERGY STORAGE SYSTEM AND METHOD FOR OPERATING SAID ELECTRICAL CIRCUIT ARRANGEMENT

BACKGROUND OF THE INVENTION

The invention relates to an electrical circuit arrangement for an energy storage system comprising a first electrochemical energy storage device and a second electrochemical energy storage device, to a method for operating said electrical circuit arrangement, and to a use of said electrical circuit arrangement.

In present safety concepts for batteries, for instance lithium-ion batteries, the battery cannot continue to operate in the event of a fault, for example if there is a fault in the voltage sensing. To satisfy the safety measures, the battery is taken into a safe state, whereby the battery is isolated from an electrical supply system of the vehicle.

With the increase in safety-relevant components in an electrical system of a vehicle comprising a 12V battery, availability of an electrical supply system of the vehicle must be guaranteed. This means that the same availability for the 48V battery is meant to apply as a safety objective. Since this safety objective is compartmentalized into the 12V battery and the 48 V battery, any occurrence of identical failure modes must be ruled out, and therefore the 48 V battery is not allowed to fail in the event of a fault in the 12V battery.

Document KR20190016401 discloses: a power conversion apparatus for a vehicle comprising a 48V battery; a 48V output terminal connected to a 48V load; a 12V output terminal connected to a 12V load; a power relay assembly arranged between the 48V battery and the 48V output terminal to be pre-charged and switched; a bidirectional DC-DC converter arranged between the 48V output terminal and the 12V output terminal for receiving 48V power and 12V power, which is meant to be converted into 12V and 48V power according to an operating mode; a battery control terminal for connecting the power relay assembly and a battery control unit; and a converter control terminal for connecting the bidirectional DC-DC converter and a converter control unit.

Document EP1333565 discloses a method and an apparatus having a factorized power architecture.

SUMMARY OF THE INVENTION

The object of the present invention is to improve further the prior art.

The procedure according to the invention has the comparative advantage that the electrical circuit arrangement comprises:
- a circuit board comprising at least one control unit;
- a first terminal for a voltage supply to electrical and/or electronic components of the circuit board by means of the first energy storage device;
- a second terminal for a voltage supply to electrical and/or electronic components, in particular to the at least one control unit, of the circuit board by means of the second energy storage device, wherein an electrical connection between the second terminal and the control unit comprises a filter circuit, a DC-DC converter and a switching element, wherein the filter circuit can be electrically connected to the DC-DC converter by means of the switching element, whereby the control unit is supplied with a voltage independently of the first energy storage device.

The at least one control unit can hence continue to be operated even in the event of a failure of the first energy storage device.

The first electrochemical energy storage device comprises a 12V battery.

The second electrochemical energy storage device comprises a 48V battery.

The electrical and/or electronic components comprise at least one microcontroller, a voltage sensor, a current sensor, a temperature sensor, a disconnection device and/or at least one communication interface.

The circuit board comprises printed circuits. A high packing density of electrical and/or electronic components can hence be achieved.

The filter circuit comprises a PI filter. Electromagnetic interference can be reduced thereby.

The DC-DC converter comprises a step-down converter. A voltage for the voltage supply to the control unit can be set thereby.

The electrical switch comprises a semiconductor switch. Rapid switching times and low switching losses can hence be achieved.

A method for operating the electrical circuit arrangement for safe operation of at least one control unit of an energy storage system, which comprises a first electrochemical energy storage device and a second electrochemical energy storage device, in the event of a fault in the first electrochemical energy storage device advantageously comprises the following steps:
a) switching a switch for electrically connecting a first electrochemical energy storage device, which is electrically connected to a first terminal, to electrical and/or electronic components, for the purpose of supplying a voltage;
b) switching a switch for electrically connecting a second electrochemical energy storage device, which is electrically connected to a second terminal, to a DC-DC converter for the purpose of supplying a voltage to electrical and/or electronic components, in particular to a control unit, in the event of a fault in the first electrochemical energy storage device.

An electrical circuit arrangement according to the invention is advantageously used in electrical energy storage devices for electric vehicles, hybrid vehicles, plug-in hybrid vehicles, aircraft, pedelecs or electric bikes, for portable telecommunications or data processing equipment, for electrical hand tools or kitchen appliances, and in stationary storage devices for storing in particular regeneratively produced electrical energy.

BRIEF DESCRIPTION OF THE DRAWING

FIG. 1 shows a schematic diagram of a first embodiment of the electrical circuit arrangement according to the invention.

DETAILED DESCRIPTION

FIG. 1 shows a schematic diagram of a first embodiment of the electrical circuit arrangement 100 according to the invention. A circuit board 101 comprises a first region containing electrical and/or electronic components 102 and a second region 103 containing electrical and/or electronic components 104, which are isolated from each other in a high-resistance manner by a third region 105.

The electrical and/or electronic components 102 comprise a voltage sensor and a plurality of communication interfaces, which can be electrically connected by means of additional terminals 124 to a bus system, for example a CAN bus, and/or to sensors.

The electrical and/or electronic components 102 can be connected via electrical lines 110 by means of a switching element 109 to a first terminal 106, for instance a positive pole of a first electrochemical energy storage device, for the purpose of supplying a voltage. The switching element 109, in particular a semiconductor switch, is switched by means of an additional terminal 108, for instance via a signal representing a vehicle start.

The electrical and/or electronic components 104, for example components of a battery management system, comprise a control unit 111, a microcontroller 112 and a disconnection device 113, for instance for overvoltage monitoring of a line 123. In addition, the electrical and/or electronic components 104 comprise a voltage sensor 117, a current sensor 118, a temperature sensor 119 and a state-of-charge balancing device 120.

The control unit 111 is electrically connected by an electrical line 122 to a DC-DC converter 116, and by the electrical line 123 to the microcontroller 112 and to the disconnection device 113 for the purpose of supplying a voltage.

The DC-DC converter 116 can be electrically connected via an electrical line 121 by means of a switching element 115 to a second terminal 107 of the circuit board 101. The electrical line 121 comprises, in addition to the switching element 115, a filter circuit 114, in particular comprising a PI filter, for the purpose of improving the electromagnetic compatibility. The switching element 115 is switched by the control unit 111, for example via a signal line. For this purpose, the control unit 111 is electrically connected to a voltage supply, for instance to a positive pole of the first energy storage device. Then, for example, on the vehicle being started, the voltage supply by the second electrical energy storage device is switched in by means of the switching element 115, so that even in the event of a failure of the first electrical energy storage device the battery management system continues to function.

The DC-DC converter 116, advantageously a step-down converter, converts the voltage present at the second terminal 107, for instance 48 V, into a lower voltage, for instance 12V, for the purpose of supplying a voltage to the control unit 111 via the electrical line 122.

The invention claimed is:

1. An electrical circuit arrangement (100) for an energy storage system comprising a first electrochemical energy storage device and a second electrochemical energy storage device, the electrical circuit arrangement comprising:
   a circuit board (101) comprising at least one control unit (111);
   a first terminal (106) for a voltage supply to electrical components of a first region of the circuit board (101) by means of the first energy storage device;
   a second terminal (107) for a voltage supply to electrical components of a second region of the circuit board (101) by means of the second energy storage device, wherein an electrical connection (121) between the second terminal (107) and the control unit (111) comprises a filter circuit (114), a DC-DC converter (116) and a switching element (115), wherein the filter circuit (114) electrically connectable to the DC-DC converter (116) by means of the switching element (115), wherein the electrical components of the first region are electrically isolated from the electrical components of the second region, whereby the control unit (111) is supplied with a voltage from the second energy storage device independently of the first energy storage device.

2. The electrical circuit arrangement (100) according to claim 1, wherein the first electrochemical energy storage device comprises a 12V battery.

3. The electrical circuit arrangement (100) according to claim 1, wherein the second electrochemical energy storage device comprises a 48V battery.

4. The electrical circuit arrangement (100) according to claim 1, wherein the electrical components comprise at least one microcontroller (112), a disconnection device (113), a voltage sensor (117), a current sensor (118), a temperature sensor (119), a state-of-charge balancing device (120) and/or at least one communication interface.

5. The electrical circuit arrangement (100) according to claim 1, wherein the circuit board (101) comprises printed circuits.

6. The electrical circuit arrangement (100) according to claim 1, wherein the filter circuit (114) comprises a PI filter.

7. The electrical circuit arrangement (100) according to claim 1, wherein the DC-DC converter (116) comprises a step-down converter.

8. The electrical circuit arrangement (100) according to claim 1, wherein the switching element (115) comprises a semiconductor switch.

9. A method for operating the electrical circuit arrangement (100) for safe operation of at least one control unit (111) of an energy storage system, which comprises a first electrochemical energy storage device and a second electrochemical energy storage device, in the event of a fault in the first electrochemical energy storage device, the method comprising the following steps:
   a) switching a switch (109) for electrically connecting a first electrochemical energy storage device, which is electrically connected to a first terminal (106), to electrical components, for the purpose of supplying a voltage, wherein the control unit (111) is isolated from the first energy storage device;
   b) switching a switch (115) for electrically connecting a second electrochemical energy storage device, which is electrically connected to a second terminal (107), to a DC-DC converter (116) for the purpose of supplying a voltage to electrical components in the event of a fault in the first electrochemical energy storage device, wherein the control unit (111) is supplied with a voltage from the second energy storage device independently of the first energy storage device.

10. The use of an electrical circuit arrangement (100) according to claim 1 in electrical energy storage devices for electric vehicles, hybrid vehicles, plug-in hybrid vehicles, aircraft, pedelecs or electric bikes, for portable telecommunications or data processing equipment, for electrical hand tools or kitchen appliances, and in stationary storage devices for storing in particular regeneratively produced electrical energy.

* * * * *